United States Patent [19]

Boucharlat

[11] Patent Number: 4,839,911
[45] Date of Patent: Jun. 13, 1989

[54] CHARGER TRANSFER SHIFT REGISTER WITH VOLTAGE SENSING DEVICE USING A FLOATING-POTENTIAL DIODE

[75] Inventor: Gilles Boucharlat, St. Egreve, France

[73] Assignee: Thomson-LSF, Paris, France

[21] Appl. No.: 39,089

[22] Filed: Apr. 16, 1987

[30] Foreign Application Priority Data

Apr. 18, 1986 [FR] France .................................. 86 05647

[51] Int. Cl.⁴ ...................... H01L 29/78; G11C 19/28
[52] U.S. Cl. ........................................ 377/57; 377/58; 377/60; 377/61; 357/24
[58] Field of Search .................... 377/57, 58, 60–63; 358/213.11, 213.23, 213.26; 357/24

[56] References Cited

U.S. PATENT DOCUMENTS

| | | | |
|---|---|---|---|
| 3,906,359 | 9/1975 | Blaha et al. | 357/24 |
| 3,921,194 | 11/1975 | Engelor et al. | 357/24 |
| 3,921,195 | 11/1975 | Smith et al. | 357/24 |
| 4,160,262 | 7/1979 | Kovac | 357/24 |
| 4,242,692 | 12/1980 | Hagiwara | 357/24 |
| 4,262,217 | 4/1981 | Levine | 377/62 |
| 4,350,976 | 9/1982 | Benoit-gonin et al. | 357/24 |
| 4,381,516 | 4/1983 | Kadota | 357/24 |
| 4,403,237 | 9/1983 | Ohkubo et al. | 377/63 |
| 4,589,005 | 5/1986 | Matsuda et al. | 377/61 |
| 4,728,622 | 3/1988 | Kamata | 357/24 |

FOREIGN PATENT DOCUMENTS

| | | | |
|---|---|---|---|
| 0097837 | 1/1984 | European Pat. Off. | 357/24 |
| 0084486 | 7/1978 | Japan | 357/24 |
| 0084488 | 7/1978 | Japan | 357/24 |
| 0121072 | 9/1979 | Japan | 357/24 |
| 0011304 | 1/1980 | Japan | 357/24 |
| 0011305 | 1/1980 | Japan | 357/24 |
| 2010010 | 6/1979 | United Kingdom | 357/24 M |

OTHER PUBLICATIONS

Patents Abstracts of Japan, vol. 2, No. 118, Sep. 30, 1978, p. 6811 E 78 & JP-A-53 84486 (Matsushita Denki Sangyo K.K.), 25-07-78.

Patents Abstracts of Japan, vol. 2, No. 118, Sep. 30, 1978, p. 6811 E 78; & JPA-53-84-488-Matsushita Denki Sangyo K.K.), 25-07-78.

Patents Abstracts of Japan, vol. 3, No. 143, Nov. 27, 1979, p. 24 E 154 & JP-A-54 121 072 (Nippon Denki K.K.), 19-09-1979.

Primary Examiner—John S. Heyman
Assistant Examiner—Tai V. Duong
Attorney, Agent, or Firm—Roland Plottel

[57] ABSTRACT

The invention pertains to a charge transfer shift register provided with a device for voltage sensing using a floating-potential diode. Towards that end of the register which is located on the floating-potential diode side, the width of the charge transfer channel diminishes gradually and symmetrically with respect to the longitudinal axis of the register, and the electrodes have a shape which is all the more similar to that of a ring sector as they are close to the floating-potential diode. Thus, the path followed by the charges which leave it up to the floating electrode are made substantially uniform for each of these electrodes, whether the charges leave the electrode near the edges of the channel or near the longitudinal axis of the register.

3 Claims, 1 Drawing Sheet

FIG_1 PRIOR ART
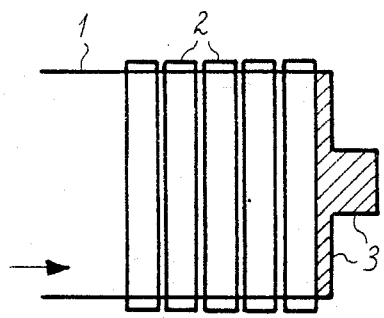
FIG_2
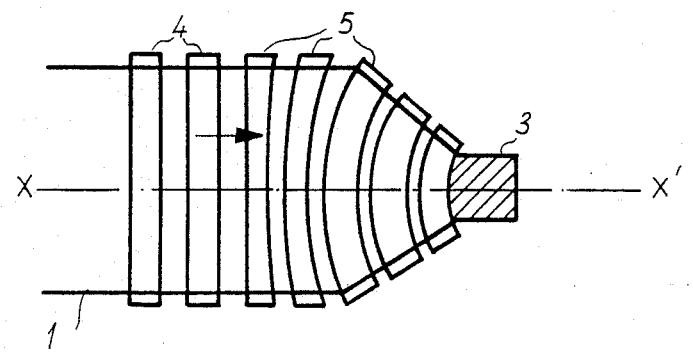
FIG_3
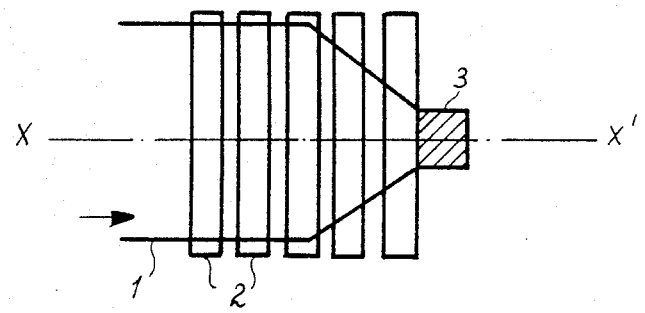

CHARGER TRANSFER SHIFT REGISTER WITH VOLTAGE SENSING DEVICE USING A FLOATING-POTENTIAL DIODE

BACKGROUND OF THE INVENTION

1.) Field of the Invention

The present invention pertains to a charge transfer shift register provided with a voltage sensing device using a floating-potential diode.

2.) Description of the Prior Art

According to a well known method in the prior art in the field of charge transfer devices, voltage sensing is done with a diode, the potential of which is pre-charged to a reference value before receiving the signal charge. This method of sensing charges is described, in particular, in the article "Les dispositifs à transfert de charge" (Charge Transfer Devices), published in the Revue Technique THOMSON-CSF, volume 12, number 1, March 1980, pages 41 to 45.

FIG. 1 gives a schematic drawing of a charge transfer shift register seen from above. The figure shows the limits of the transfer channel of the charges 1, which have a constant width, perpendicular to the direction in which the charges are transferred, indicated by a horizontal arrow. The figure also depicts a few rectangular electrodes 2 which are identical to one another. The shift register ends in a diode 3 designed to collect the charges coming from the register. This diode comprises a first part which occupies the entire width of the channel, followed by a second part, of smaller width, to which is connected the input of a high-impedance output amplifier. This known structure can be used to conduct a voltage sensing operation using a floating-potential diode.

SUMMARY OF THE INVENTION

The present invention proposes a new structure which can be used to improve the voltage sensing on the floating-potential diode. In particular, the sensitivity and linearity are improved. The inefficiency of the transfer is reduced. The operating frequency of the charge transfer register can be increased.

The present invention pertains to a charge transfer shift register provided with a device for voltage sensing with a floating-potential diode, the said register comprising a channel for the transfer of charges of a constant width in a direction perpendicular to that of the charge transfer, and electrodes of constant size, depending on the direction in which the charges are transferred, the said diode being connected to an end of the register where it occupies the entire width of the channel, a shift register wherein, towards that end of the register which is located on the floating-potential diode side, the width of the channel gradually diminishes, and the last electrodes have a shape which is all the more similar to a ring sector as they are close to the floating-potential diode so as to make the path followed by the charges which leave it up to the floating electrode substantially uniform for each of these electrodes, whether the charges leave the electrode near the edges of the channel or near the longitudinal axis of the register.

BRIEF DESCRIPTION OF THE DRAWINGS

Other objects, characteristics and results of the invention will emerge from the following description which is given as a non-exhaustive example and illustrated by the appended figures, of which:

FIG. 1 is a schematic view of a charge transfer shift register provided with a voltage sensing device using a floating-potential diode according to the prior art;

FIG. 2 is a schematic view of a charge transfer shift register provided with a voltage sensing device with a floating-potential diode according to the invention;

FIG. 3 is a schematic view of a charge transfer shift register provided with a device for voltage sensing with a floating-potential diode, according to a mode of embodiment which is close to the invention but does not give satisfaction.

In the various figures, the same references designate the same elements but, for reasons of clarity, the dimensions and proportions of the various elements are not maintained.

DESCRIPTION OF THE PREFERRED EMBODIMENT

FIG. 1 has been described in the introduction to the description.

FIG. 2 schematically depicts a view from the top of a charge transfer shift register provided with a device for voltage sensing with a floating-potential diode according to the invention.

It is seen that the width of the channel 1, i.e. its dimension perpendicular to the direction in which the charges are transferred, indicated by a horizontal arrow, is first constant and then, towards the end of the channel located on the sensing diode 3 side, the said width gradually diminishes symmetrically with respect to the longitudinal axis XX' of the register.

The sensing diode 3 occupies the entire width of the charge transfer channel.

It is seen in FIG. 2 that, in that part of the register where the channel has a constant width, the electrodes are rectangular electrodes which are identical to one another as are the two electrodes 4 which are depicted. Then, in the vicinity of the position where the width of the channel diminishes, the shape of the electrodes has been modified. The electrodes 5 of the register, which are located in the vicinity of the sensing diode 3, have a shape which is all the more similar to that of a ring sector as they are close to the sensing diode 3.

It is known that to increase the sensitivity of a voltage sensing operation performed with a floating-potential diode placed at the output of a charge transfer shift register, it is necessary to reduce the capacity of the sensing diode and, hence, its area and its perimeter.

As compared with the structure of the prior art depicted in FIG. 1, the structure of FIG. 2 depicts a sensing diode 3 with a smaller area and a smaller perimeter and, hence, a smaller capacity, thus improving the sensitivity of the sensing.

It is seen that the same width as in the case of FIG. 1 is kept for the charge transfer channel, except in the vicinity of the sensing diode 3 where the width of the channel gradually diminishes.

If, along with the channel of FIG. 2, rectangular and identical electrodes 2 are kept all along the channel, the results obtained are not satisfactory. For, according to this hypothesis, which is depicted in FIG. 3, for the electrodes close to the sensing diodes 3, the distance to be travelled to reach the diode 3 is far longer for the charges that leave a given electrode near the edges of the channel than for the charges leaving the same electrode near the axis XX'. Now, calculations show that the transferring time of a packet of charges varies substantially according to the square of the distance to be travelled. Consequently, the structure of FIG. 3 is not satisfactory for it makes it necessary either to work at lower frequencies than those attained with the device of FIG. 1, thus making it possible to await the arrival of the charges that have travelled the longest distances, or to allow an operation with poor linearity.

FIG. 2 shows how the electrodes have been modified to eliminate the disadvantage of the device of FIG. 3.

Near the sensing diode 3, the shape of the electrodes is modified so as to make the path of the charges that lead each electrode up to the sensing diode 3 substantially uniform, whether these charges leave the electrode near the edges of the channel or near the axis XX'.

In FIG. 2, the depicted mode of embodiment of the invention comprises, after rectangular and identical electrodes 4, electrodes with an intermediate shape between the rectangle and the ring sector, a shape that approaches that of the ring sector towards the sensing diode 3. The concave part of the electrodes is pointed towards the sensing diode 3.

The last electrode of the register may have the exact shape of a ring sector.

Depending on the characteristics sought for the shift register provided with a device for voltage sensing with a floating-potential diode, the following points are determined: the way in which the channel is modified, the number of electrodes which are not rectangular and the shape of these electrodes.

As for the masks used to obtain the non-rectangular electrodes, data-processing means can be used to obtain them.

The electrodes with a modified shape do not necessarily have the same width on the axis XX'. However, the electrodes of the register must all have the same active area, i.e. The same storage capacity.

Thus, in one example of a mode of embodiment, the following characteristics were calculated:
Width of channel before narrowing: 40 microns;
Acive width of channel at position of the sensing diode: 18 microns;
Distance from sensing diode to the point at which the width of the channel diminishes: 30 microns;
Width of rectangular electrodes, depending on the direction of the transfer: 6.75 microns;
Number of non-rectangular electrodes: 3;
Dimension of sensing diode: circle with a diameter of 14 microns, corresponding to an area of 155 $\mu$m2;
Area of sensing diode used in the prior art with a channel of constant width equal to 40 microns: 270 $\mu$m2.

In FIG. 2, it is seen that the sensing diode has an approximately square shape, with the dimension by which it receives the charges from the register being substantially shaped like the arc of a circle, thus making it possible to make the best possible use of its perimeter. A circular diode may be used, making it possible to obtain the smallest possible perimeter for a given area.

The structure proposed by the invention can be used to obtain high sensitivity and improved transferring efficiency at the final stages of the register. The time taken for the arrival of the charges at the sensing diode is reduced and, therefore, the video signal is set up more rapidly on this sensing diode.

It is possible to increase the operating frequency of the charge transfer register and the sensing diode has a more linear response.

In the mode of embodiment of the invention depicted in FIG. 2, towards the end of the register the width of the charge transfer channel 1 decreases gradually and symmetrically with respect to the longitudinal axis XX' of the register. It is understood that this last characteristic is not obligatory and that the invention also covers modes of embodiment in which the width of the charge transfer channel diminishes gradually but not symmetrically with respect to the longitudinal axis XX' of the register.

What is claimed is:

1. Charge transfer shift register having a device for voltage sensing with a floating-potential diode, said register comprising a channel for the transfer of charges, said diode being placed adjacent to one end of the register where it occupies the entire width of the channel, said channel having a first portion of constant width in a direction perpendicular to that of the charge transfer, and a second portion extending from one end of the first portion up to said diode, said second portion having a gradually diminishing width towards said diode, wherein most of the electrodes of said first portion have a rectangular shape, and the last electrodes of the register have a shape gradually varying from a rectangular shape on the first portion side opposite to said diode to an annular shape towards said diode.

2. Register according to the claim 1 wherein, towards that end of the register
which is located on the floating-potential diode side, the width of the channel diminishes gradually and symmetrically with respect to the longitudinal axis of the register.

3. Register according to the claim 1, wherein the floating-potential diode is approximately square shaped, with the side through which the charges from the register arrive being shaped substantially like the arc of a circle.

* * * * *